(12) United States Patent
Kovacevic et al.

(10) Patent No.: US 7,062,247 B2
(45) Date of Patent: Jun. 13, 2006

(54) ACTIVE DOUBLE-BALANCED MIXER

(75) Inventors: Milan Kovacevic, Princeton, NJ (US);
Mohammad Madihian, Princeton, NJ (US)

(73) Assignee: NEC Corporation, Tokyo (JP)

( * ) Notice: Subject to any disclaimer, the term of this patent is extended or adjusted under 35 U.S.C. 154(b) by 361 days.

(21) Appl. No.: 10/144,782

(22) Filed: May 15, 2002

(65) Prior Publication Data
US 2003/0216131 A1 Nov. 20, 2003

(51) Int. Cl.
H04B 1/26 (2006.01)

(52) U.S. Cl. ............... 455/323; 455/311; 455/333; 330/261

(58) Field of Classification Search ........... 455/118, 455/296, 311, 313, 317, 318, 319, 323, 326, 455/333; 330/252, 261
See application file for complete search history.

(56) References Cited

U.S. PATENT DOCUMENTS

| | | | | | |
|---|---|---|---|---|---|
| 4,156,283 | A | * | 5/1979 | Gilbert | ............... 708/835 |
| 4,931,746 | A | * | 6/1990 | Trankle et al. | ............... 330/254 |
| 5,140,286 | A | * | 8/1992 | Black et al. | ............... 331/99 |
| 5,920,810 | A | * | 7/1999 | Finol et al. | ............... 455/313 |
| 6,144,846 | A | * | 11/2000 | Durec | ............... 455/323 |
| 6,230,001 | B1 | | 5/2001 | Wyse | |
| 6,275,688 | B1 | | 8/2001 | Takagi et al. | |
| 6,345,178 | B1 | | 2/2002 | Haapala | |
| 6,348,830 | B1 | * | 2/2002 | Rebeiz et al. | ............... 327/355 |
| 6,515,547 | B1 | * | 2/2003 | Sowlati | ............... 330/311 |
| 6,587,678 | B1 | * | 7/2003 | Molnar et al. | ............... 455/323 |
| 6,704,559 | B1 | * | 3/2004 | Hageraats | ............... 455/326 |

OTHER PUBLICATIONS

Axel Schmidt et al.; "A Universal Dual Band LNA Implementation in SiGe Technology for Wirless Applications"; IEEE Journal of Solid-State Circuits; vol. 36, No. 7; Jul. 2001; pp. 1127-1131.

Dennis Yee et al; "A 2-GHz Low-Power Single-Chip CMOS Receiver for WCDMA Applications"; Berkeley Wireless Research Center; Dept. of EECS; University of California (Berkeley); pp. 1-4.

K. Kivekäs et al.; "Design of Low-Voltage Active Mixer For Direct Conversion Receivers"; Electronic Circuit Design Laboratory; Helsinki University of Technology; 2001; pp. 382-385.

Esa Tiliharju et al.; "A Direct-Conversion BICMOS Mixer for GHZ Applications"; Helsinki University of Technology; Electronic Circuit Design Laboratory; Department of Electrical and Communications Engineering; 2001; pp. 1599-1602.

(Continued)

*Primary Examiner*—Edward F. Urban
*Assistant Examiner*—Blane Jackson
(74) *Attorney, Agent, or Firm*—Sughrue Mion, PLLC

(57) ABSTRACT

The present invention describes active double-balanced mixers. The mixers use an isolation and matching section that provides RF section input matching and superior isolation between the LO and RF port. The mixers can be implemented using an inexpensive semiconductor processing technology, obviating the need for matching inductors and facilitating a low-cost, low-power fully integrated wireless receiver.

10 Claims, 4 Drawing Sheets

OTHER PUBLICATIONS

Kiran Nimmagadda et al.; "A 1.9GHz Double-Balanced Subharmonic Mixer for Direct Conversion Receivers"; IEEE Radio Frequency Integrated Circuits Symposium; 2001; pp. 253-256.

Zhaofeng Zhang et al.; "A CMOS Self-Mixing-Free Front-End for Direct Conversion Applications"; Department of Electrical & Electronic Engineering Hong Kong University of Science & Technology; 2001; pp. 386-389.

Danilo Manstretta et al.; "Low 1/f Noise CMOS Active Mixers for Direct Conversion"; IEEE Transactions on Circuits and Systems—II; Analog and Digital Signal Processing; vol. 48; No. 9; Sep. 2001; pp. 846-850.

* cited by examiner

ACTIVE DOUBLE-BALANCED MIXER

BACKGROUND OF THE INVENTION

1. Field of the Invention

The present invention relates to mixers, and more particularly relates to self-matched fundamental and subharmonic active double-balanced mi

2. Description of Related Art

Recently there has been a great amount of activity in realizing low-cost low-power integrated wireless receivers. Wireless receivers general more downconversion stages, each of which contributes to power consumption. Low-power receivers can be realized if the number of downconversion stages is reduced to one. Low-cost receivers can be realized using an inexpensive semiconductor processing technology, which typically does not feature high quality factor (high-Q) inductors. Downconversion stages use a mixer for the frequency translation from the radio frequency (RF) to the intermediate frequency (IF). If the IF frequency is not equal to 0, the receiver is generally known as superheterodyne, whereas if the frequency is equal to 0, the receiver is known as homodyne or Direct Conversion Receiver (DCR).

A conventional double-balanced Gilbert mixer, as shown in FIG. 1, is used in a downconversion stage for both superheterodyne receivers and DCRs. The use of a double-balanced Gilbert mixer in a DCR may lead to self-mixing, local oscillator (LO) leakage and DC offsets, which occur due to the same frequency of the RF and LO signals. A double-balanced Gilbert mixer can be modified to effectively address the problems associated with DCRs. A conventional active subharmonic double-balanced mixer, as shown in FIG. 2, is a modification of the double-balanced Gilbert mixer of FIG. 1. An active subharmonic double-balanced mixer alleviates the problem of self-mixing and DC offsets by using an LO signal that has a frequency that is approximately one-half the RF signal frequency.

The input of both a double-balanced Gilbert mixer and an active subharmonic double-balanced mixer needs to be matched to the nominal impedance. In order to do this, conventional mixer input matching techniques require inductive components (e.g. high-Q integrated chip inductors or off-chip inductors) to resonate the capacitive input of the mixer. However, integrated high-Q inductors are not available in inexpensive processes. In addition, they occupy large areas of the semiconductor real estate. Finally, off-chip inductors add to the assembly and packaging cost.

The applicability of a double-balanced Gilbert mixer in a DCR is limited because of the imperfect isolation between the LO and RF ports. As the LO signal is often considerably stronger than the RF signal, it leaks into the RF port through a parasitic path between the (LO and RF) ports. A LO signal coupled to the RF port mixes with the LO signal from the LO port and produces a static DC offset. A LO signal coupled to the RF port may also radiate through the antenna, due to the imperfect isolation of the receive RF path, reflect off moving objects, and penetrate the receiver. The received LO signal mixes with the LO signal from the LO port and produces a time-variable DC offset. In order to reduce DC offsets, it is advantageous to improve the isolation between the RF and LO ports.

BRIEF SUMMARY OF THE INVENTION

An object of this invention is to realize a low-cost self-matched receive mixer, eliminating the need for inductors to match the mixer input.

Another object of this invention is to improve the isolation between the RF and LO ports and suppress DC offsets and LO signal leakage.

In a preferred embodiment of an active self-matched double-balanced mixer both the RF and LO input can be single-ended or differential. Additionally, the IF output can be single-ended or differential. The mixer includes an RF section, a matching and isolation section and an LO section.

The RF section provides voltage-to-current conversion of the input RF signal. The matching and isolation section provides: 1) a match of the RF section input to the nominal impedance; and 2) superior isolation between the RF and LO ports. The RF section (without bias) consists of two transistors. Capacitive collector loading of the RF section transistors shifts the input Miller impedance from capacitive to real and provides an RF section input match for a broad frequency range. The matching and isolation section (without bias) consists of two transistors, two resistors and four capacitors. The LO section consists of either four or eight transistors, depending whether the mixer operates as fundamental or subharmonic.

An advantage of the present invention over the conventional mixers includes the mixer being self-matched, without internal or external inductors. The input match is better than −10 dB in the frequency span of over 3 GHz. The present invention also has superior isolation between the LO and RF ports, suppressing DC offsets and LO leakage. Finally, the present invention can be implemented using an inexpensive digital semiconductor processing technology which does not feature inductors.

BRIEF DESCRIPTION OF THE DRAWINGS

The above and further objects, features and advantages of the invention will become clear from the following more detailed description when read with reference to the accompanying drawings in which.

DETAILED DESCRIPTION OF THE INVENTION

Figure 3:
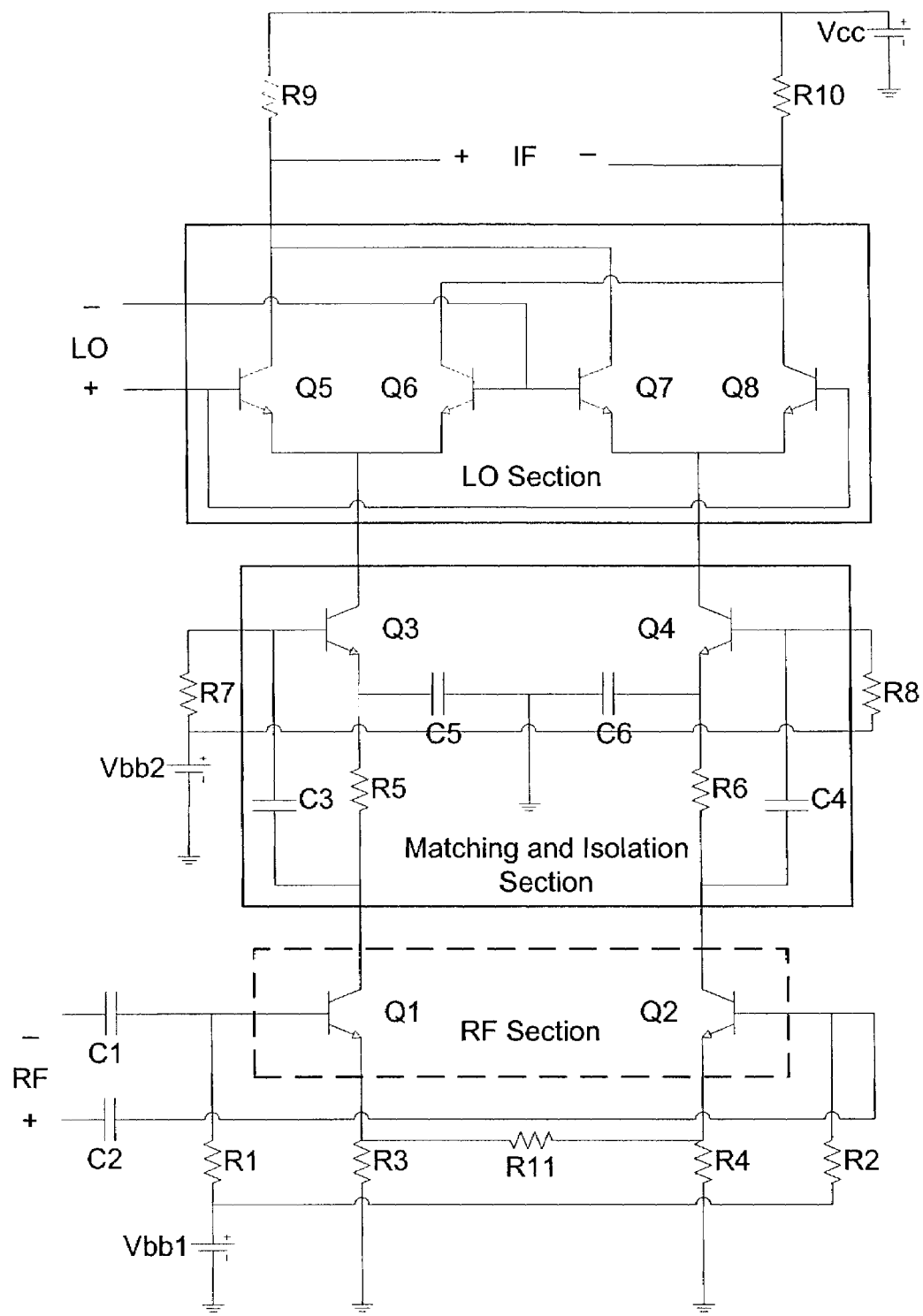
FIG. 3 is a schematic diagram of a self-matched fundamental active double-balanced mixer according to an embodiment of the present invention.
Figure 4:
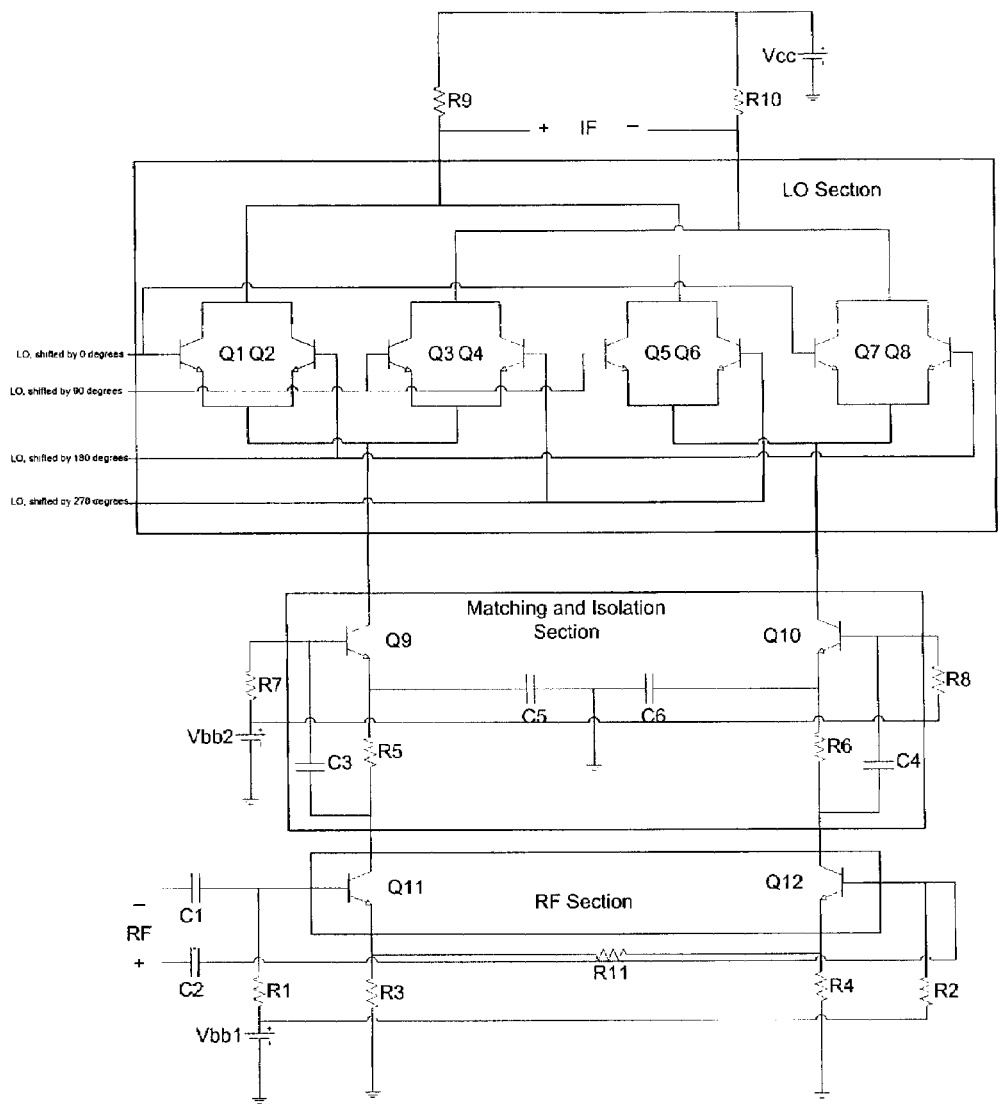
FIG. 4 is a schematic diagram of a self-matched subharmonic active double-balanced mixer according to an embodiment of the present invention.

Two preferred active double-balanced mixer embodiments are depicted in FIGS. 3 and 4. FIG. 3 is a self-matched fundamental active double-balanced mixer and FIG. 4 is a self-matched subharmonic active double-balanced mixer. An RF section provides voltage-to-current conversion of the input RF signal. A matching and isolation section is used for RF input matching in both the fundamental and subharmonic active double-balanced mixers. A matching and isolation section also provides superior isolation between the LO and RF mixer ports. Therefore, the LO signal is less likely to couple to the RF port, thereby reducing the DC offset level and LO leakage.

An LO section can be implemented with two differential transistor pairs, as shown in FIG. 3, or four differential transistor pairs, as shown in FIG. 4. In the subharmonic embodiment, the LO signal leakage to the RF port is further reduced by using unequal LO and RF frequencies. The mixer load in FIG. 3 and FIG. 4 is passive. Alternatively, the load may be active.

In a self-matched fundamental active double-balanced mixer, as shown in FIG. 3, the RF signal is input to the bases of transistors Q1 and Q2, which operate in common-emitter configurations. The RF input can be either single-ended or differential. The transistors Q1 and Q2, as shown in FIG. 3, perform voltage-to-current conversion. C1 and C2 are decoupling capacitors. The collectors of Q1 and Q2 are capacitively coupled to the bases of transistors Q3 and Q4, which also operate in common-emitter configurations. Capacitors C5 and C6 ensure that AC ground is presented to transistors Q3 and Q4 and define the load of the transistors Q1 and Q2. The collectors of transistors Q3 and Q4 are coupled to the LO section, or resistors coupled to the LO section, if the goal is to further suppress third-order intermodulation distortion. The RF section input impedance is matched by proper sizing of resistors R5 and R6 and capacitors C3, C4, C5 and C6. The LO-RF port isolation is improved by the collector-emitter isolation of transistors Q3 and Q4 and attenuation of resistors R5 and R6.

The LO section consists of two differential pairs (Q5–Q6 and Q7–Q8). The LO signal is divided into two components phase-shifted by 180°, each of which is applied to the base of two transistors of distinct differential pairs in the LO section. The LO section translates the RF signal to the intermediate frequency, which is equal to the absolute value of the difference between the RF and LO frequencies. In a fundamental active double-balanced mixer for a DCR, the RF and LO frequencies are approximately equal, therefore, the IF frequency is approximately equal to 0. The collectors of Q5, Q6, Q7 and Q8 are coupled to the mixer load, which could be passive or active. In FIG. 3, the mixer load is represented by resistors R9 and R10. Voltage source Vbb1 provides bias current for the RF section. Voltage source Vbb2 provides bias for the matching and isolation section. Voltage source Vcc is the mixer supply voltage. Resistors R1 and R2 are RF section bias resistors, whereas resistors R7 and R8 are matching and isolation section bias resistors. Resistors R3, R4 and R11 linearize the RF section.

In a self-matched subharmonic active double-balanced mixer as shown in FIG. 4, the RF signal is input to the bases of transistors Q11 and Q12, which operate in common-emitter configurations. The RF input can be either single-ended or differential. The transistors Q11 and Q12, as shown in FIG. 4, perform voltage-to-current conversion. C1 and C2 are decoupling capacitors. The collectors of Q11 and Q12 are capacitively coupled to the bases of transistors Q9 and Q10, which also operate in common-emitter configurations. Capacitors C5 and C6 ensure that AC ground is presented to transistors Q9 and Q10 and define the load of the transistors Q11 and Q12. The collectors of transistors Q9 and Q10 are coupled to the LO section, or resistors coupled to the LO section, if the goal is to further suppress third-order intermodulation distortion. The RF section input impedance is matched by proper sizing of resistors R5 and R6 and capacitors C3, C4, C5 and C6. The LO-RF port isolation is improved by the collector-emitter isolation of transistors Q9 and Q10 and attenuation of resistors R5 and R6. The LO section consists of four differential pairs (Q1–Q2, Q3–Q4, Q5–Q6 and Q7–Q8). The LO signal is divided into four components phase-shifted by 90°, each of which is applied to the bases of two transistors in the LO section (e.g. LO shifted by 90° is applied to the bases of Q3 and Q5). The LO section translates the RF signal to the intermediate frequency, which is equal to the absolute value of the difference between the RF and a double of the LO frequencies. In a subharmonic active double-balanced mixer for a DCR, the RF frequency is approximately equal to twice the LO frequency, therefore, the IF frequency is approximately equal to 0. The collectors of Q1–Q8 are coupled to the mixer load, which could be passive or active. In FIG. 4, the mixer load is represented by resistors R9 and R10. Voltage source Vbb1 provides bias current for the RF section. Voltage source Vbb2 provides bias for the matching and isolation section. Voltage source Vcc is the mixer supply voltage. Resistors R1 and R2 are RF section bias resistors, whereas resistors R7 and R8 are matching and isolation section bias resistors. Resistors R3, R4 and R11 linearize the RF section.

The following table compares a typical conventional to a typical self-matched fundamental (subharmonic) active double-balanced mixer in terms of input matching and LO-RF isolation. All numbers refer to the RF frequency 2 GHz, supply voltage 3 V, and power dissipation 6.5 mW. The input is matched to 2*50 Ω; the output load is 2*1000 Ω.

Figure 1:
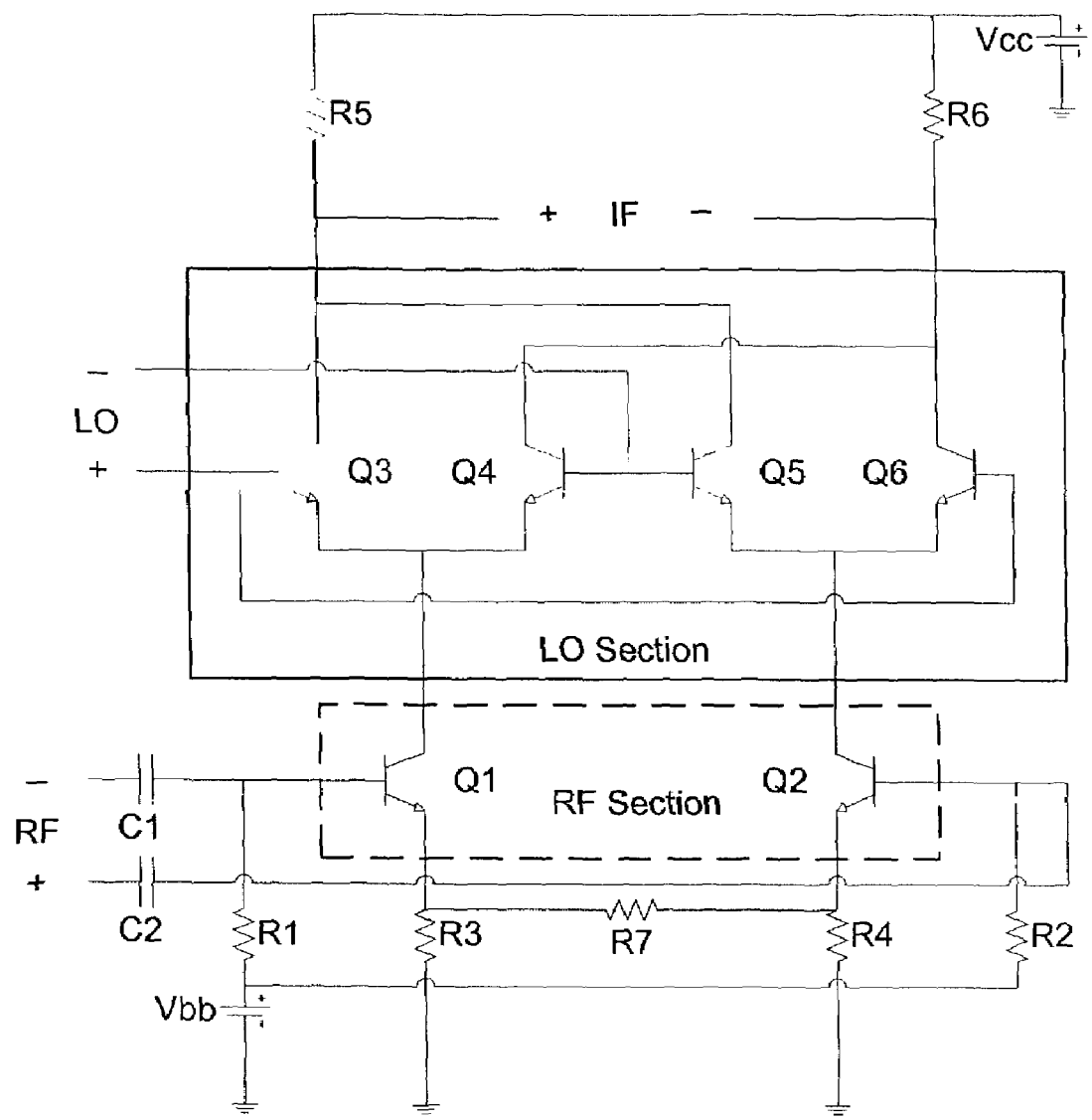
FIG. 1 is a schematic diagram of a conventional fundamental active double-balanced mixer.
Figure 2:
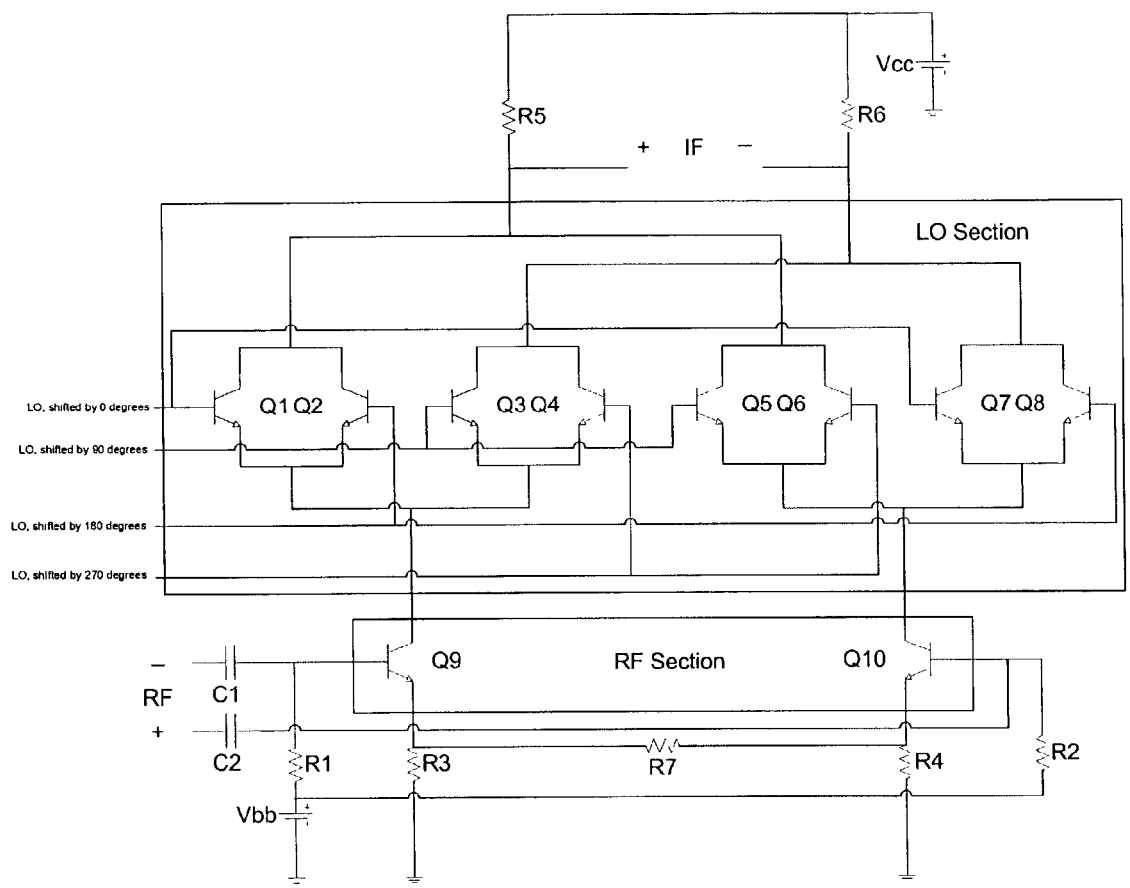
FIG. 2 is a schematic diagram of a conventional subharmonic active double-balanced mixer.

|  | Conventional fundamental active double-balanced mixer (FIG. 1) | Conventional subharmonic active double-balanced mixer (FIG. 2) | Self-matched fundamental active double-balanced mixer (FIG. 3) | Self-matched subharmonic active double-balanced mixer (FIG. 4) |
| --- | --- | --- | --- | --- |
| Input Matching S11 [dB] | −2 | −2 | −11 | −11 |
| LO-RF Isolation [dB] | −24 | −29 | −42 | −48 |

While these figures are representative for input matching and LO-RF isolation of the conventional and claimed mixers, they may vary due to different processing parameters, mixer specifications and design goals, and the implemented tradeoff between noise, power dissipation, input matching, linearity, conversion gain and frequency.

While this invention describes an active double-balanced mixer, it is possible to design a single-balanced mixer with improved LO-RF isolation and matching, which has an RF section comprising one transistor, a matching and isolation section comprising one transistor, and an LO section comprising one or two differential transistor pairs, depending on whether the mixer operates as fundamental or subharmonic.

While this invention has been described in its preferred form, it will be appreciated that changes may be made in the form, construction, procedure and arrangement of its various elements and steps without departing from its spirit or scope.

What is claimed is:

1. A mixer comprising:
 a local oscillator switch coupled to a local oscillator;
 an inductorless transconductor coupled to an RF signal input, the inductorless transconductor further comprising four transistors arranged in a first and second stage, each of the two transistors in the first stage being coupled to a first stage load and to the local oscillator switch, the second stage of two transistors being capacitively coupled to bases of the two transistors in the first stage, and the RF signal input being capacitively coupled to bases of the two transistors in the second stage, whereby the inductorless transconductor provides isolation between the local oscillator and the RF signal input and reduces DC offsets.

2. The mixer of claim 1 wherein the local oscillator has a frequency which is a fundamental-tone frequency of the RF signal input.

3. The mixer of claim 2 wherein the local oscillator switch comprises two differential pairs of transistors.

4. The mixer of claim 1 wherein the local oscillator has a frequency which is a subharmonic frequency of the RF signal input.

5. The mixer of claim 4 wherein the local oscillator switch comprises four differential pairs of transistors coupled to four component signals from the local oscillator, where the four component signals are each phase shifted from each other.

6. The mixer of claim 1 wherein the first stage loads coupled to the two transistors in the first stage further comprise resistive elements, where the resistive elements are arranged in parallel with capacitive elements between the two transistors in the second stage and the two transistors in the first stage and where the resistive elements and capacitive elements are sized so as to provide impedance matching for the RF signal input.

7. The mixer of claim 6 wherein the first stage of transistors is coupled at the bases of the transistors to a voltage source.

8. The mixer of claim 7 wherein the first stage of transistors is capacitively coupled at emitters of the transistors to ground.

9. The mixer of claim 1 wherein the transistors are selected from the group of bipolar junction transistors, heterojunction bipolar transistors, junction field effect transistors, III–V compound field effect transistors, metallic semiconductor field effect transistors, and pseudomorphic high electron mobility transistors.

10. The mixer of claim 1 wherein the mixer is a component in a direct conversion receiver.

* * * * *

UNITED STATES PATENT AND TRADEMARK OFFICE
CERTIFICATE OF CORRECTION

PATENT NO. : 7,062,247 B2  Page 1 of 1
APPLICATION NO. : 10/144782
DATED : June 13, 2006
INVENTOR(S) : Milan Kovacevic It is certified that error appears in the above-identified patent and that said Letters Patent is hereby corrected as shown below:

Column 1, line 12
Delete "general" and insert -- generally comprise one or --

Signed and Sealed this

Thirtieth Day of September, 2008

JON W. DUDAS
*Director of the United States Patent and Trademark Office*